United States Patent
Ho

(10) Patent No.: US 7,683,656 B1
(45) Date of Patent: Mar. 23, 2010

(54) PREDRIVER EQUALIZATION FOR COMMON MODE NOISE REDUCTION IN A SEMI-DIFFERENTIAL CURRENT MODE DRIVER

(75) Inventor: Yick Yaw Ho, Melaka (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/272,201

(22) Filed: Nov. 17, 2008

(51) Int. Cl.
*H03K 17/16* (2006.01)
*H03K 19/003* (2006.01)

(52) U.S. Cl. .............................. 326/21; 326/22; 326/86; 326/82

(58) Field of Classification Search ........................ None
See application file for complete search history.

(56) References Cited

U.S. PATENT DOCUMENTS

2005/0057280 A1* 3/2005 Groen et al. .................. 326/86
2008/0218222 A1* 9/2008 Nishi .......................... 327/108

* cited by examiner

*Primary Examiner*—Anh Q Tran
(74) *Attorney, Agent, or Firm*—Blakely, Sokoloff, Taylor & Zafman LLP

(57) ABSTRACT

Predriver equalization is described. A predriver includes a predriver equalizer to provide equalization on outputs of predrivers. The predriver equalization causes the predrivers to drive the output driver and a preemphasis driver with signals equalized to reduce common mode noise on the output signal. The predrivers can be implemented as complementary semi-differential driver circuits or as complementary logic circuits with weak pull-downs. The driver complexity can be reduced to the use of a semi-differential driver with the use of the predriver equalization.

18 Claims, 5 Drawing Sheets

PREDRIVER EQUALIZATION FOR COMMON MODE NOISE REDUCTION IN A SEMI-DIFFERENTIAL CURRENT MODE DRIVER

FIELD

Embodiments of the invention are generally related to driver circuits, and more particularly to predriver equalization for common mode noise reduction.

BACKGROUND

The output signal on digital output lines can be affected by noise introduced into the signal by any of a number of factors, including, environmental factors or operating conditions of the circuit, load on the circuit, component processing variations, etc. The noise can cause poor performance, and in some cases prevent compliance with governing standards for input/output (I/O) communication on the output line. In particular, noise can affect high speed serial interfaces, which can experience EMI (electromagnetic interference) problems if the output common mode noise rises above certain levels. For semi-differential buffers with channel equalization (preemphasis and deemphasis), the common mode noise is a design challenge due to the $V_{DS}$ modulation effect on transistor current source and low power supply level. The $V_{DS}$ modulation effect refers to the fact that the current may be affected by changes in the voltage difference between the drain (D) and source (S), which may reduce a saturation margin, which modulates the current. As used herein, a preemphasis bit refers to a transitioning bit and deemphasis bit refers to a non-transitioning bit.

An output driver is traditionally used to amplify the input signal as well as provide common mode rejection. Differential drivers or differential amplifiers to drive the output line are known and commonly used to achieve the necessary amplification as well as providing common mode rejection on the output signal. However, full differential amplifiers are expensive in terms of component count, die or circuit area, and power consumption. The fully differential driver also increases pad capacitance and degrades return loss. Fully complimentary circuits used to produce differential amplifiers are also more sensitive to process mismatches. Fully differential buffers are also complicated on die termination schemes.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, predriver equalization is described. A predriver includes a predriver equalizer to provide equalization on outputs of predrivers. The predriver equalization causes the predrivers to drive the output driver and a preemphasis driver with signals equalized to reduce common mode noise on the output signal. The predrivers can be implemented as complementary semi-differential driver circuits or as complementary logic circuits with weak pull-downs. The driver complexity can be reduced to the use of a semi-differential driver with the use of the predriver equalization.

Figure 1:
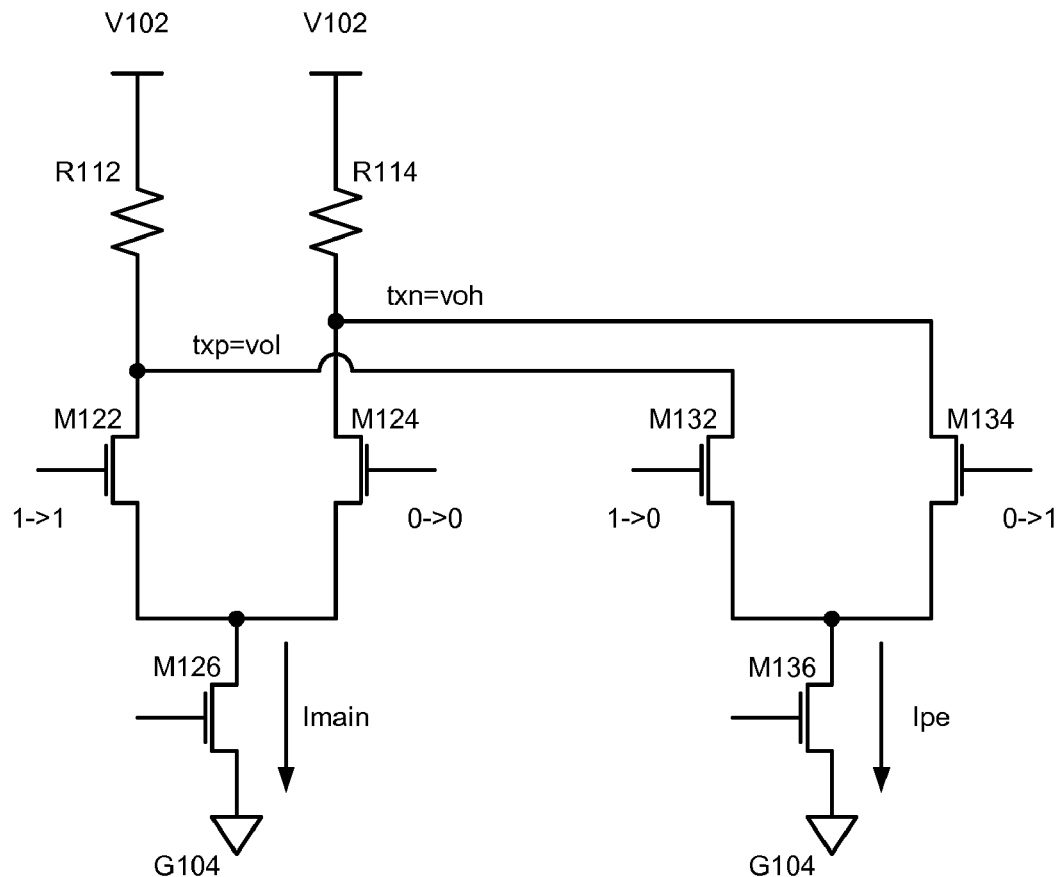
FIG. 1 is a block diagram of an embodiment of a semi-differential output driver with preemphasis.
Figure 1:
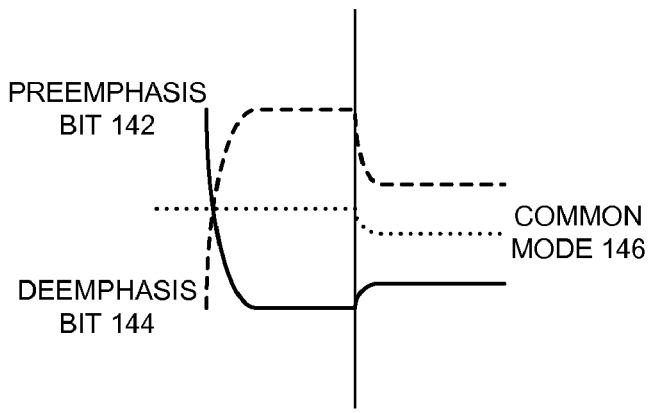

FIG. 1 is a block diagram of an embodiment of a semi-differential output driver with preemphasis. System 100 includes a voltage high reference (V102), and a low voltage reference (G104, which may be an analog ground, an earth ground, or some other lower voltage potential than V102, even a reference of negative potential). Resistors R112 and R114 represent an output load on the main driver (driver transistors M122 and M124), and the preemphasis driver (preemphasis transistors M132 and M134). In the example of system 100, txp is drive to a logic HIGH level. The drains of M122 and M132 are connected at the output high voltage node ($V_{OH}$), and the drains of M124 and M134 are connected at the output low voltage node ($V_{OL}$). The sources of M122 and M124 are connected, and coupled to the drain of M126, through which Imain flows. Imain refers to the current source through the main driver. The sources of M132 and M134 are similarly connected, and coupled to the drain of M136, through which Ipe flows. Ipe is the current of the preemphasis (equalization) driver.

Semi-differential drivers such as shown in system 100 are not traditionally used as output drivers. Semi-differential drivers do not have the necessary amplification traditionally required for driving the output. Note system 100 includes equalization at the preemphasis stage. Equalization at the preemphasis stage results in a response curve such as that shown in FIG. 1. Observe common mode 146 between the responses of preemphasis bit 142 and deemphasis bit 144. The preemphasis and deemphasis levels are typically unequal in a traditional driver with preemphasis, resulting in common mode noise (e.g., when the VCC supply is low, such as when operating from a low-voltage rail). Thus, semi-differential buffers are not used as output drivers. However, when used in conjunction with predriver equalization as described in more detail below, system 100 can be used as an output driver.

For an AC-coupled differential buffer with external load R and internal termination to VCC, the output $V_{OH}$ and $V_{OL}$ are given by the following equations:

Transition(Preemphasis)$V_{OHpe}=VCC-0.25*(Imain+Ipe)*R;$  (1)

Transition(Preemphasis)$V_{OLpe}=VCC-0.75*(Imain+Ipe)*R;$  (2)

Non-transition(Deemphasis)$V_{OHde}$=VCC−
0.25*Imain*R−0.75*Ipe*R; and  (3)

Non-transition(Deemphasis)$V_{OHde}$=VCC−
0.75*Imain*R−0.25*Ipe*R.  (4)

The current source $V_{DS}$ is given by the node voltages of ccmain and ccpe, which are given by the pad voltages minus the IR drop across the driver switch. When the pads are switching, the common node voltages change accordingly. The turn-on resistance for the main driver switch and preemphasis driver are given as Routmain and Routpe, respectively. The following equations show the calculated values of ccmain and ccpe:

Transition(Preemphasis)ccmain=$V_{OLpe}$−
Imain*Routmain;  (5)

Non-transition(Deemphasis)ccmain=$V_{OLde}$−
Imain*Routmain;  (6)

Transition(Preemphasis)ccpe=$V_{OLpe}$−Ipe*Routpe; and  (7)

Non-transition(Deemphasis)ccpe=$V_{OHde}$−Ipe*Routpe.  (8)

In equations 5 and 6, Routmain is R112, while Routpe is R114. Based on the equations above, the changes in the common node voltages (i.e., the current source voltage, $V_{DS}$) between a transition bit and non-transition bit are given below in equations 9 and 10. Similar equations can be derived for a $V_{SS}$ terminated driver.

Delta$V$ccmain=$V_{OLde}$−Imain*Routmain−$V_{OLpe}$+
Imain*Routmain=0.5*Ipe*R;  (9)

Delta$V$ccmain=$V_{OHde}$−Ipe*Routpe−$V_{OHpe}$+
Ipe*Routpe=0.5*Imain*R.  (10)

Common mode noise on the output signal may result from changes to the current source voltage, $V_{DS}$, when the output signal is switching. With these voltage changes, the effective current Imain and Ipe changes during preemphasis (transition) and deemphasis (non-transition).

Predriver equalization as described herein can reduce the common mode noise on a semi-differential buffer. It allows circuit to be designed without using the fully complimentary differential buffer and its associated complexities. The predriver equalization and semi-differential output driver removes the needs for complimentary driver switches and current source, extra predrivers, and a more complex termination scheme as required by traditional fully complimentary differential output drivers. The semi-differential buffer has better voltage headroom than a fully differential buffer as the platform voltage scales down. A semi-differential buffer is also not as sensitive to process mismatches as a traditional differential buffer. Thus, the use of system 100 as a driver has advantages over traditional fully complimentary differential driver circuits.

Figure 2:
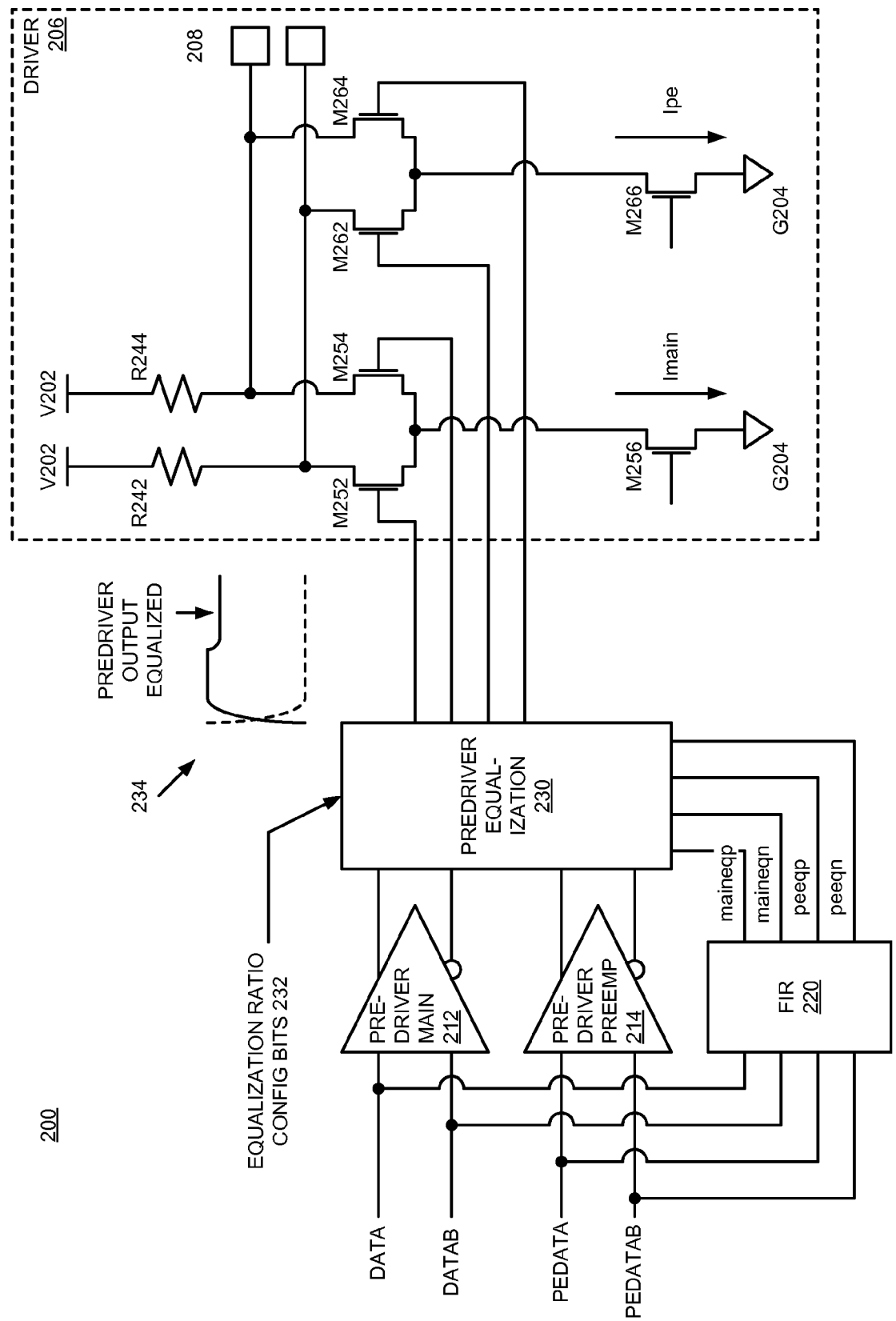
FIG. 2 is a block diagram of an embodiment of an output driver with predriver equalization.

FIG. 2 is a block diagram of an embodiment of an output driver with predriver equalization. System 200 includes driver 206 with a predriver. Note that system 200 illustrates simplified diagrammatic representations of circuit elements. In practice each component of system 200 may include more elements than what is explicitly shown in FIG. 2. Observe also that the circuits in system 200 are more specifically configured as an NMOS (negatively doped metal-oxide-semiconductor (MOS)) circuit; however, a similar circuit with p-type (positively doped) transistors would be apparent to one of ordinary skill in the art based on system 200.

Generally regarding the driver and predriver as described herein, applying equalization on the predriver stage can improve performance by reducing output common mode noise. The predriver drives one voltage level to the driver for transition (preemphasis) bits and a different voltage level for non-transition (deemphasis) bits. From equations 9 and 10 above, it can be seen that changes in the driver common node is a function of main current, preemphasis current, and the output resistance of the output transistor, Rout. The current for the system should be fixed or determined by signal integrity, and thus the performance can be affected by manipulating Rout. When the switch is fully on in linear region, the following applies:

$$\text{Driver Switch Rout} = \frac{L}{k_n * W * (V_{GS} - V_T - V_{DS})},$$  (11)

where $k_n$ refers to a conductance parameter of the device based on device and processing parameters, L and W refer to the physical geometry of the switch (referring to channel and gate lengths, respectively), $V_{GS}$ is the gate to source voltage, $V_{DS}$ is the drain to source voltage, and $V_T$ is the threshold or turn-on voltage. By varying the $V_{GS}$ of the driver switches, the common node or output node can be kept at a stable voltage level. For the main driver, when (Routmain|preeemp−Routmain|deemp) equals 0.5*Ipe*R (from Equation 9), the ccmain would be at same voltage level during preemphasis and deemphasis bits. Similarly for preemphasis driver, when (Routpe|preeemp−Routpe|deemp) equals 0.5*Imain*R (from Equation 10). Thus, the preemphasis output resistance at preemphasis minus the preemphasis output resistance at deemphasis should be equal to one half the value of These relationships can be shown as:

Delta$V$ccmain=0.0 when [(Routmain|preem−
Routmain|deemp)=0.5*Ipe*R]; and  (12)

Delta$V$ccpe=0.0 when [(Routpe|preem−
Routpe|deemp)=0.5*Imain*R].  (13)

Referring more specifically to the Figure, system 200 includes predriver equalization 230 to equalize the output signal of the predriver stage to input into driver 206. In one embodiment, the amount of predriver equalization is controlled via a set of programmable configuration bits, shown as equalization ratio configuration bits 232.

Figure 3B:
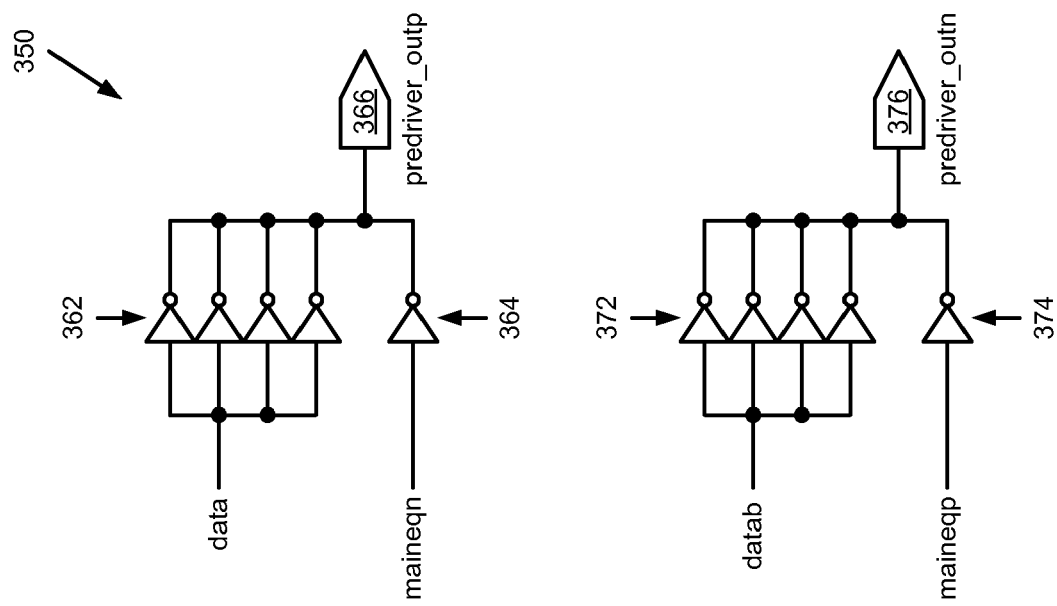
FIGS. 3A and 3B are representations of embodiments of a predriver equalizer.
Figure 3A:
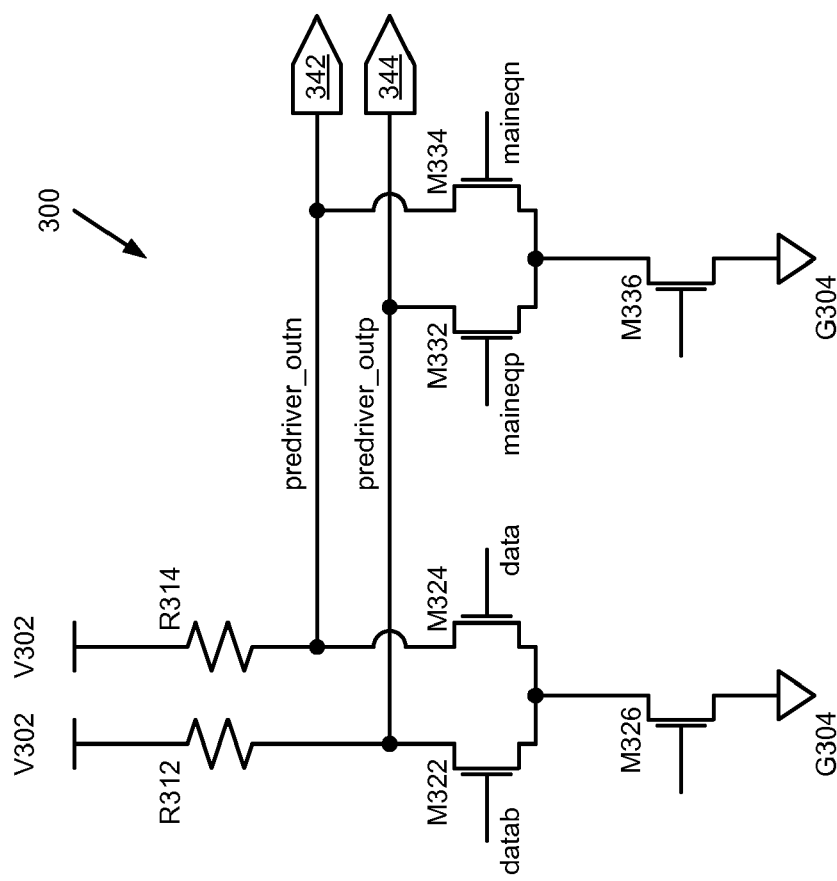

Inputs data and datab are input into predriver main 212, which pedata and pedatab are input into predriver 214. Data and datab represent the signal to be output on output line 208. Pedata and pedatab are the preemphasis signals to provide preemphasis control at the output. The predrivers (212, 214) provide output to predriver equalization 230, which equalizes the signals, to implement equations 12 and 13. There are different types of circuits that may be used to implement equations 12 and 13, two examples of which are shown in FIGS. 3A and 3B.

Inputs data, datab, pedata, and pedatab are also input into FIR (finite impulse response) 220 filter. In one embodiment, FIR 220 identifies whether the current pad signal is a preemphasis or deemphasis bit. FIR 220 outputs signals maineqp, maineqn, peeqp, and peeqn. Signals maineqp and maineqn are signals to change the main predriver output voltage level for the signal and its complement. Thus, maineqp affects the main predriver equalization for the p-type, and maineqn for the n-type. Similarly, peeqp and peeqn affect the preemphasis predriver output for the preemphasis signal and its complement.

In one embodiment, FIR 220 performs a simple combinational logic on the input data to determine whether the current bit is a preemphasis (transitional) bit or a deemphasis (nontransitional) bit. Assuming data and datab are the current data and its complement to be transmitted, and pedata and pedatab are the preemphasis (equalization) data bits, the truth table for a filter table for FIR 220 is given by:

maineqp=data NOR pedatab
    maineqn=datab NOR pedata
    peeqp=datba NOR pedata
    peeqn=data NOR pedatab Observe the effect on the predriver output, as illustrated in graph 234. Graph 234 is not necessarily drawn to scale, but shows a lower preemphasis drop after equalization. The predriver output equalized as shown in graph 234 has a different form than the graph shown in FIG. 1 using only output stage preemphasis, for example.

The equalized signal is received at driver 206. Driver 206 includes voltage reference V202 and ground G204. The output is the common node as shown at 208. Resistors R242 and R244 illustrate the output load. The main driver circuit includes transistors M252, M254, and M256, with main output current Imain. The preemphasis circuit includes transistors M262, M264, and M266, with preemphasis current Ipe.

FIGS. 3A and 3B are representations of embodiments of a predriver equalizer. There may be many circuit implementations that will provide the predriver equalization. Two such examples are semi-differential buffer 300 of FIG. 3A, which may also be referred to as a common mode logic (CML) predriver, and CMOS (complementary MOS) predriver circuit 350.

Considering FIG. 3A, CML predriver 300 specifically shows an n-type approach, and a similar structure using PMOS for a p-type predriver is not shown. The structure is the same semi-differential buffer that can be used for the main output driver when predriver equalization is employed. CML predriver 300 includes reference voltage V302 and reference ground G304, which would generally be the voltage reference and ground reference of the driver that is being predriven. The inputs to CML predriver 300 are the data and datab signals, as well as the maineqp and maineqn signals generated by FIR 220 of FIG. 2.

For purposes of discussion, consider CML predriver 300 to have two portions: a data portion (transistors M322, M324, and M326), and an equalization portion (M332, M334, M336). Signal data is received at the noninverting input of the data portion, namely, at the gate of M324. Signal datab is received at the inverting input, at the gate of M322. Similarly, signal maineqn is received at the noninverting input of the equalization portion at the gate of M334, while maineqp is received at the inverting input at the gate of M332. The resulting signals at the common nodes, 342, and 344, are, respectively, predriver_outn and predriver_outp. Similar outputs would be generated for the preemphasis driver.

Considering FIG. 3B, CMOS predriver 350 includes inverter buffers to drive the predriver_outn and predriver_outp signals. Briefly, CMOS predriver 350 achieves equalization by having a weak pull-down when the predriver is driving a logic high. For example, the predriver may drive 1.0V during a transition bit, and 0.95V during a non-transition bit. The voltage values will be understood to simply be exemplary, and the amount of predriver equalization is programmable. Thus, when data drives output 366 high through inverters 362, maineqn can weakly pull down the signal through inverter 364. Similarly, when datab drives output 376 high through inverters 372, maineqp can weakly pull down the signal through inverter 374.

Figure 4:
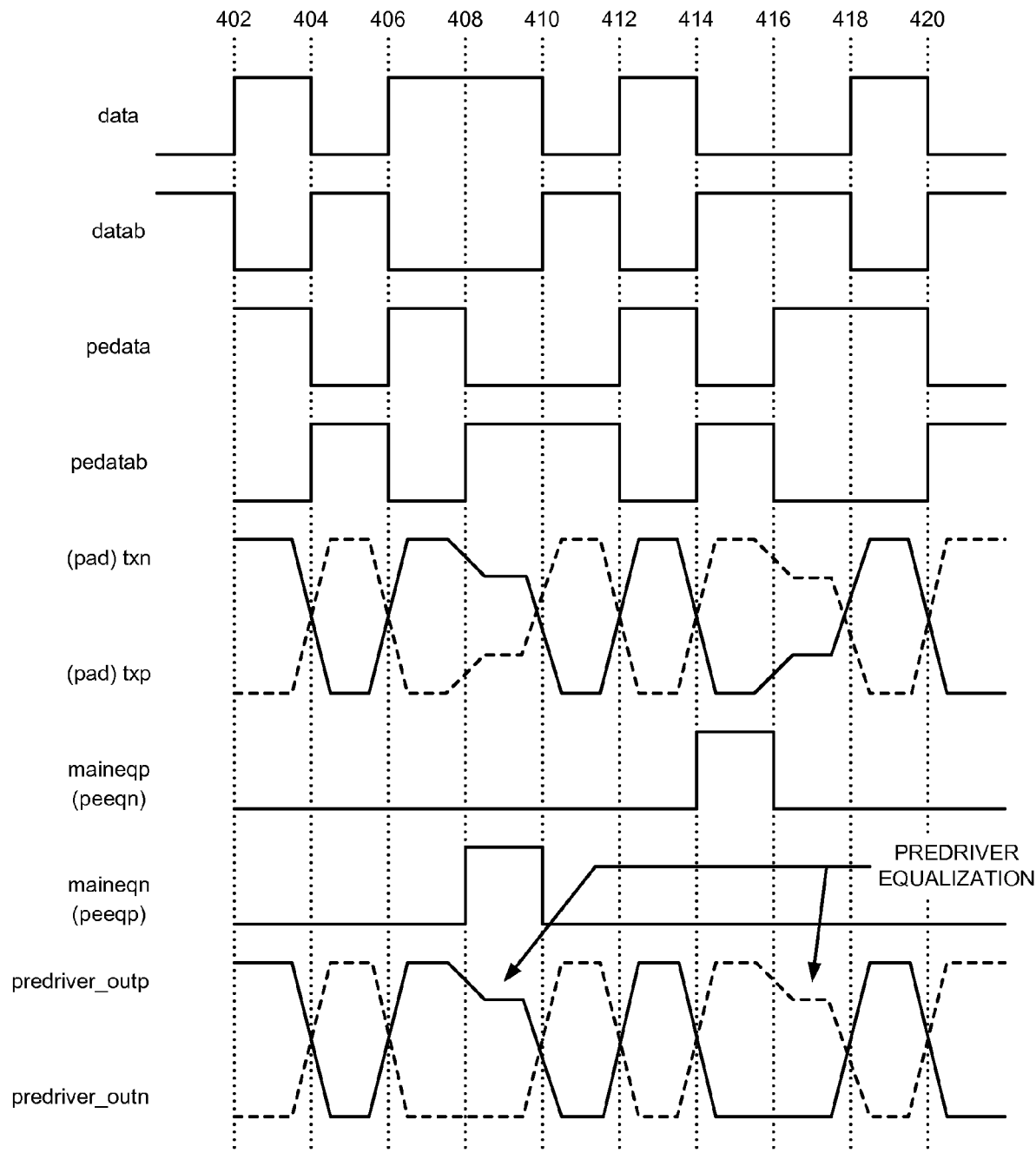
FIG. 4 is a representation of an embodiment of a timing diagram illustrating predriver equalization.

FIG. 4 is a representation of an embodiment of a timing diagram illustrating predriver equalization. In the timing illustration, the signal curves will be discussed with reference to switching or transition times 402-420. The signal curves are discussed with reference to the equations at the top of the figure, where maineqp=data NOR pedatab;
    maineqn=datab NOR pedata;
    peeqp=datba NOR pedata; and
    peeqn=data NOR pedatab.

The signals data and datab are shown to complement each other, as do signals pedata and pedatab. Thus, data arbitrarily begins as a logic low, transitions to a logic high at 402, transitions to a logic low at 404, transitions to a logic high at 406, stays at a logic high at 408, transitions to a logic low at 410, transitions to a logic high at 412, transitions to a logic low at 414, stays a logic low at 416, transitions to a logic high at 418, and transitions to a logic low at 420. The signal datab complements data, and thus begins as a logic high, transitions to a logic low at 402, transitions to a logic high at 404, and so forth. Signal pedata begins as a logic high at 402, transitions to a logic low at 404, transitions to a logic high at 406, transitions to a logic low at 408, stays a logic low at 410, transitions to a logic high at 412, transitions to a logic low at 414, transitions to a logic high at 416, stays a logic high at 418, and transitions to a logic low at 420. Signal pedatab, as a complement to pedata begins as a logic low at 402, transitions to a logic high at 404, and so forth.

Given the relationship between maineqp and signals data and pedatab, the curve for maineqp will be observed to stay a logic low from 402 to 414, transitions to a logic high at 414, transitions to a logic low at 416, and continues at a logic low until 420. The high value between 414 and 416 is the only time on the curves that data NOR pedatab is TRUE. Observe that peeqn has an identical curve to maineqp. Similarly, maineqn is only a logic high between 408 and 410, which is the only time on the curves that datab NOR pedata is TRUE. Thus, maineqn (and peeqp) are a logic low until 408, transition to a logic high at 408, transition to a logic low at 410, and continue a logic low until 420.

The effects of the signals on the circuits of system 200 are illustrated in the curves for txn and txp, the signals as shown on the pad. The txn and txp curves are complementary, with txn illustrated with a solid line, and txp illustrated with a dashed line. The slope of the curves illustrates the ramp up and ramp down effects due to capacitance, switching characteristics, etc., which are understood by those of skill in the art. Pad txn begins as a logic high at 402, transitions to a logic low at 404, transitions to a logic high at 406, and then transitions to a lower logic high at 408. Note that the logic high level of txn at 408 will be calculated to be sufficiently high allow detection of the logic high at a receiving device, but is not quite as high as necessary to cause the transition on the output signal. The high logic level needs to start at a higher level to ramp up the signal in time for detection to take place, but does not need to stay so high to continue to be detected. Thus, a non-transition bit can be output at a lower level to save power. Signal txn transitions to a logic low at 410, transitions to a logic high at 412, transitions to a logic low at 414, transitions to a higher logic low at 416, and then transitions to a logic high at 418. Signal txn transitions then transitions to a logic low at 420, which is the end of the example of FIG. 4. Signal txp is the exact complement of txn.

The signals for predriver_outp and predriver_outn are similar, but are not exact complements. Specifically, predriver_outp tracks the curve of txn exactly, except at 416, where txn transitions to a higher logic low, whereas predriver_outp continues at a full logic low. The cause for the transition in txn is the pulse in maineqp. Similarly, predriver_outn tracks txp exactly, except at 408, where txp transitions to a high logic low, whereas predriver_outn continues at a full logic low. The cause for the transition in txp is the pulse in maineqn. The non-transition bit transitions to lower logic highs in predriver_outp and predriver_outn show the predriver equalization.

Figure 5:
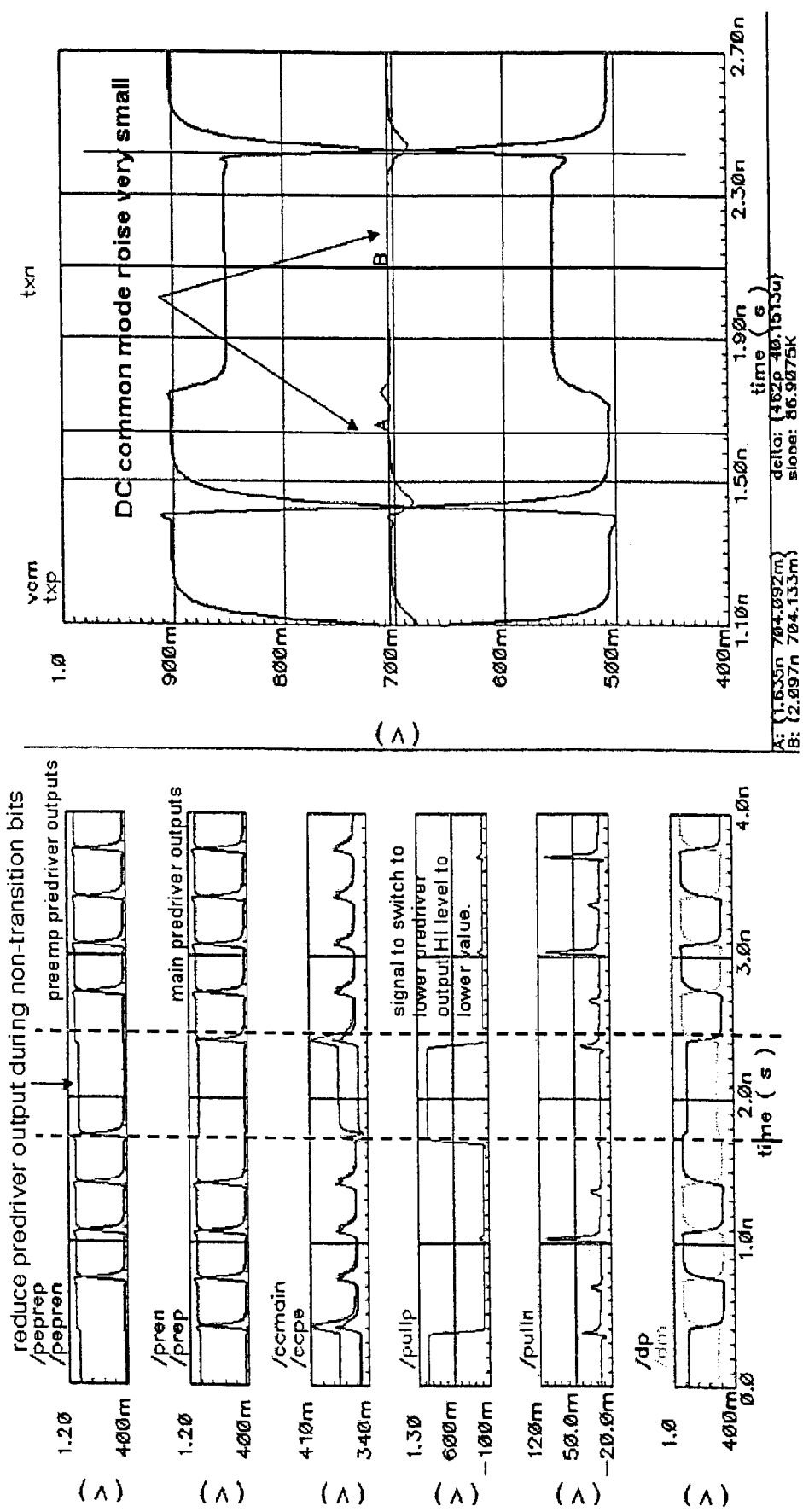
FIG. 5 is a representation of an embodiment of simulation results for a driver with predriver equalization.

FIG. 5 is a representation of an embodiment of simulation results for a driver with predriver equalization. On a driver with predriver equalization such as shown in FIG. 2, output results may be as illustrated. The predriver outputs labeled as prep, pren, peprep, and pepren show the predriver equalization effect where the output logic high values are different during transition and non-transition bits. The common node ccmain and ccpe voltage levels are more stable at a fixed value. The waveform on the right, showing txn and txp, showing Vcm versus time exhibits a reduced common mode noise. In addition to the simulation results shown, other simulations have shown the driver and predriver described herein are robust across process, voltage, and temperature (PVT) variations. Common mode noise reduction by approximately 50% can be achieved across PVT.

To the extent various operations or functions are described herein, they may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a main predriver to receive an input signal and drive an output driver in accordance with the input signal to generate an output signal on an output line;
   a preemphasis predriver to receive a preemphasis signal corresponding to the input signal, and drive a preemphasis driver to provide preemphasis on the output signal; and
   a predriver equalizer to receive the main predriver output and the preemphasis predriver output, and to provide output signal equalization to cause the predrivers to drive the output driver and the preemphasis driver with signals equalized to reduce common mode noise on the output signal.

2. The apparatus of claim 1, wherein the input signal and the preemphasis signal include complementary input signals and complementary preemphasis signals, respectively.

3. The apparatus of claim 2, wherein either or both of the main predriver and the preemphasis predriver comprise:
   a common mode logic circuit having a semi-differential output based on the complementary input signals or preemphasis signals.

4. The apparatus of claim 2, wherein either or both of the main predriver and the preemphasis predriver comprise:
   a complementary metal oxide semiconductor logic circuit that generates a weak pull down on the predriver output when an input signal is a logic high.

5. The apparatus of claim 2, further comprising:
   a finite impulse response (FIR) filter to receive the complementary input signals and the complementary preemphasis signals, and generate equalization signals to input into the predriver equalizer, to cause the predriver equalizer to generate an equalization signal in the predriver output.

6. The apparatus of claim 5, wherein the FIR filter generates a first pulse corresponding to a NOR of the input signal and the complement of the preemphasis signal, and generates a second pulse corresponding to a NOR of the complement of the input signal and the preemphasis signal, wherein the first pulse causes predriver equalization on an inverting predriver output, and the second pulse causes predriver equalization on a noninverting predriver output.

7. A system comprising:
   a semi-differential output driver having a main driver portion and a preemphasis portion, the main driver portion to drive an output line in accordance with an input signal, and the preemphasis portion to provide preemphasis on the output line in accordance with non-transition bits in the input signal;
   a main predriver to receive the input signal and drive the main driver portion in accordance with the input signal to generate an output signal on the output line;
   a preemphasis predriver to receive a preemphasis signal corresponding to the input signal, and drive the preemphasis portion to provide preemphasis on the output signal; and
   a predriver equalizer coupled between the predrivers and the semi-differential output driver, to receive the main predriver output and the preemphasis predriver output, and to provide output signal equalization to cause the predrivers to drive the main driver portion and the preemphasis portion with signals equalized to reduce common mode noise on the output signal.

8. The system of claim 7, wherein the input signal and the preemphasis signal include complementary input signals and complementary preemphasis signals, respectively.

9. The system of claim 8, wherein either or both of the main predriver and the preemphasis predriver comprise:
   a common mode logic circuit having a semi-differential output based on the complementary input signals or preemphasis signals.

10. The system of claim 8, wherein either or both of the main predriver and the preemphasis predriver comprise:

a complementary metal oxide semiconductor logic circuit that generates a weak pull down on the predriver output when an input signal is a logic high.

11. The system of claim 8, further comprising:

a finite impulse response (FIR) filter to receive the complementary input signals and the complementary preemphasis signals, and generate equalization signals to input into the predriver equalizer, to cause the predriver equalizer to generate an equalization signal in the predriver output.

12. The system of claim 11, wherein the FIR filter generates a first pulse corresponding to a NOR of the input signal and the complement of the preemphasis signal, and generates a second pulse corresponding to a NOR of the complement of the input signal and the preemphasis signal, wherein the first pulse causes predriver equalization on an inverting predriver output, and the second pulse causes predriver equalization on a noninverting predriver output.

13. A method comprising:

receiving a data output signal from a data signal predriver, the data output signal corresponding to an input signal to be output on a digital output line;

receiving a preemphasis signal from a preemphasis predriver, the preemphasis signal to adjust the data output signal with preemphasis corresponding to non-transition bits in the input signal;

generating equalization control at the predriver stage on the data output signal and the preemphasis signal;

outputting an equalized predriver signal from the predriver stage to the output driver.

14. The method of claim 13, wherein receiving the data output signal and receiving the preemphasis signal comprise:

receiving complementary signal pairs from the data signal predriver and the preemphasis driver, the complementary signal pairs including a signal and a complement of the signal.

15. The method of claim 14, wherein generating equalization control further comprises:

generating a equalization signals based on the input signals and the preemphasis signals, including generating a finite impulse response (FIR) filter response.

16. The method of claim 15, wherein generating the FIR filter response comprises:

generating a first pulse corresponding to a NOR of the input signal and the complement of the preemphasis signal, and generating a second pulse corresponding to a NOR of the complement of the input signal and the preemphasis signal, wherein the first pulse causes predriver equalization on an inverting predriver output, and the second pulse causes predriver equalization on a noninverting predriver output.

17. The method of claim 13, wherein generating equalization control further comprises:

generating a signal to adjust an output resistance of an output transistor in a data output driver to satisfy a condition that the output resistance of the output driver transistor in preemphasis is greater than the output resistance at deemphasis by a value of one-half an output load times a preemphasis current.

18. The method of claim 13, wherein generating equalization control further comprises:

generating a signal to adjust an output resistance of an output transistor in a preemphasis driver to satisfy a condition that the output resistance of the preemphasis output transistor in preemphasis is greater than the output resistance at deemphasis by a value of one-half an output load times a main driver current.

* * * * *